(12) United States Patent
Tsunezaki et al.

(10) Patent No.: US 7,069,649 B2
(45) Date of Patent: Jul. 4, 2006

(54) CAPACITOR DEVICE AND FABRICATING METHOD THEREOF

(75) Inventors: Minoru Tsunezaki, Hirakata (JP); Tsuyoshi Yoshino, Kameoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/334,454

(22) Filed: Jan. 19, 2006

(65) Prior Publication Data

US 2006/0120012 A1 Jun. 8, 2006

Related U.S. Application Data

(62) Division of application No. 10/734,290, filed on Dec. 15, 2003.

(30) Foreign Application Priority Data

Jan. 10, 2003 (JP) .............................. 2003-004458

(51) Int. Cl.
*H05K 3/30* (2006.01)
(52) U.S. Cl. ...................... 29/832; 361/272; 361/274.3
(58) Field of Classification Search ................ 361/272, 361/274.1, 274.2, 274.3, 301.5, 328, 329, 361/323; 29/832
See application file for complete search history.

(56) References Cited

U.S. PATENT DOCUMENTS 2,949,182 A * 8/1960 Williams .................... 206/718
4,643,929 A * 2/1987 Watanabe et al. .......... 428/34.7
6,064,563 A   5/2000 Yamada et al.

FOREIGN PATENT DOCUMENTS

JP       2001-196265       7/2001

* cited by examiner

*Primary Examiner*—K Cuneo
*Assistant Examiner*—Ivan Carpio
(74) *Attorney, Agent, or Firm*—McDermott Will & Emery LLP

(57) ABSTRACT

The invention relates to a capacitor device comprising the combination of a cylindrical capacitor and a holder for holding the capacitor in a sideways position. The holder includes a capacitor holding part that has an opening at the top and is arc-shaped in cross section, and a mounting part for mounting the holder itself to another device. The capacitor is held in a sideways position in the holding part of the holder with a heat shrinking resin tube interposed therebetween. Accordingly, the height of the capacitor device is reduced, so that the size of the capacitor device can be reduced. In addition, the connection distance between the capacitor device and another electronic device is shortened, so that the inductance can be made smaller.

2 Claims, 4 Drawing Sheets

US 7,069,649 B2

CAPACITOR DEVICE AND FABRICATING METHOD THEREOF

RELATED APPLICATIONS

This application is a divisional of U.S. patent application Ser. No. 10/734,290, filed Dec. 15, 2003, which is based on Japanese Patent Application No. JP 2003-004458, filed Jan. 10, 2003 the contents of which are hereby incorporated by reference.

BACKGROUND OF THE INVENTION

The present invention relates to capacitor devices including a capacitor, which is integrally mounted in a holder having a mounting part for a device that uses the capacitor, and to methods of fabricating the capacitor devices.

The present invention pertains to capacitor devices designed for relatively large-sized capacitors, specifically cylindrical capacitors of a size of about 35 mm in diameter and about 80 mm in length or of a larger size, for use in various electric and electronic appliances. A typical example of such capacitors is an electrolytic capacitor disclosed in U.S. Pat. No. 6,064,563, of which entire disclosure including specification, claims, drawings and abstract are incorporated herein by reference in its entirety.

Relatively large-sized capacitors of this kind can not be mounted firmly just by directly connecting their lead wires to, for example, a printed circuit board, unlike smaller-sized capacitors. Therefore, such capacitors are conventionally mounted to another device as follows.

FIG. 7 is a perspective view of a conventional capacitor device comprising the combination of a capacitor and a holder for mounting the capacitor on another device. FIG. 8 is a perspective view of the holder of the conventional capacitor device.

A capacitor 10 includes a bottomed cylindrical metallic case (not shown in the figure), a capacitor element and an electrolyte accommodated in the case, and a sealing plate 11 that seals the upper opening of the case. The capacitor 10 is coated with a heat shrinking resin tube 14 from the side face of the case to the circumference of the sealing plate 11. A pair of terminals 12 is provided on the sealing plate 11 while being insulated from the sealing plate 11. The terminals 12 have a screw hole 13 in the top. A bus bar 16 with a hole 17 can be connected to the terminal 12 with a bolt 15, as illustrated in FIG. 6.

A holder 40 for mounting the capacitor 10 on a device 50 includes a holding part 41, which is a belt-like metal plate bent into a circle. The holder 40 also includes a bolt 43 and a nut 44 for fastening folded parts 42 at both ends of the holding part 41, and three mounting feet 45 for securing the holder to the device 50. The mounting feet 45 have a screw hole 46.

In order to mount the capacitor 10 on the device 50, the holding part 41 of the holder 40 is fitted around the capacitor 10, and the folded parts 42 are fastened together with the bolt 43 and the nut 44. Subsequently, the mounting feet 45 with the screw holes 46 are screwed to the device 50. In this way, the capacitor 10 is fixed to a device, such as an electronic device, an industrial machine, an automobile, etc., by the holder 40.

An example of such prior art technique is Japanese Laid-Open Patent Publication No. 2001-196265.

Since the above-described capacitor device is so configured that the capacitor 10 is fixed to the holder 40 in a vertical position, the capacitor device is large in height and therefore has a disadvantage of being unable to be mounted in cases of limited mounting space. Also, when the capacitor 10, which is in a vertical position, is connected to another adjacent electronic-device, there is a large distance between the terminals 12 of the capacitor 10 and the terminals of the electronic device. Thus, a problem of large inductance (L) in a mounted state arises.

Further, this capacitor device needs such parts as the bolt 43 and the nut 44 in order to secure the capacitor 10 to the holder 40, so the shape of the holder becomes complicated, consequently causing an increase in costs.

BRIEF SUMMARY OF THE INVENTION

The present invention seeks to provide a small-sized, low-cost capacitor device that solves these conventional problems and is not subject to limitations on mounting space.

The present invention provides a capacitor device including a cylindrical capacitor and a holder for holding the capacitor. The holder includes a capacitor holding part that has an opening at the top and is arc-shaped in cross section, and a mounting part for mounting the holder itself to another device. The capacitor is held in a sideways position in the holding part of the holder with a heat shrinking resin tube interposed therebetween.

Since the capacitor device of the present invention is so configured that the cylindrical capacitor is held in the holder in a sideways position, the height of the capacitor device can be reduced, so that it is possible to reduce the size of the capacitor device. Also, when this capacitor is connected to another electronic device, the connection distance between the terminals of the capacitor and the electronic device is shorter than the distance with the conventional capacitor in a vertical position. Therefore, the inductance (L) in a mounted state can be reduced.

The present invention also provides a method of fabricating the capacitor device comprising the cylindrical capacitor and the holder for holding the capacitor. The method includes the steps of: fitting the capacitor into the heat shrinking resin tube having an internal diameter greater than the external diameter of the capacitor and inserting the fitted capacitor into the holding part of the holder in a sideways position; pulling the resin tube outward from the opening of the holding part; and heating the heat shrinking resin tube so that it shrinks and adheres to the outer face of the capacitor.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

As described above, the present invention is directed to a capacitor device comprising the combination of a cylindrical capacitor and a holder for holding the capacitor in a sideways position. The holder includes a capacitor holding part that has an opening at the top and is arc-shaped in cross section, and a mounting part for mounting the holder itself to another device. The capacitor is held in a sideways position in the holding part of the holder with a heat shrinking resin tube interposed therebetween. The present invention is also directed to the capacitor device, wherein the heat shrinking resin tube has been heat shrunk so that it has sufficient thickness to substantially close the gap between the holding part and the capacitor.

In a preferable embodiment of the present invention, the width of the opening of the holding part is less than twice the radius of the arc of the holding part.

This structure allows the holding part of the holder to firmly hold the capacitor with the resin tube therebetween.

In another preferable embodiment of the present invention, the holding part of the holder has radiating fins on the outer surface.

Since the fins effectively radiate heat when the capacitor generates heat, it is possible to prevent performance degradation due to the heat.

In still another preferable embodiment of the present invention, the radius of the arc of the holding part of the holder is half the external diameter of the capacitor plus a range of the thickness of the resin tube before shrinking to the thickness of the resin tube after shrinking.

This enables the holding part to more firmly hold the capacitor.

As the heat shrinking resin tube used in the present invention, it is preferable to use a tube made of polyolefin such as polyethylene or polypropylene.

A method of fabricating the capacitor device in accordance with the present invention preferably includes the steps of: fitting the capacitor into the heat shrinking resin tube having an internal diameter greater than the external diameter of the capacitor and inserting the fitted capacitor into the holding part of the holder in a sideways position; pulling the resin tube outward from the opening of the holding part; and heating the heat shrinking resin tube so that it shrinks and adheres to the outer face of the capacitor.

In another preferable embodiment of the present invention, the heating of the heat shrinking resin tube is performed by heating the holder.

This method allows the heat shrinking resin tube to shrink uniformly, thereby enhancing the holding power of the holder with the resin tube therebetween.

The present invention is preferably applied to capacitors of about 35 to 90 mm in diameter and about 80 to 150 mm in length.

Preferable embodiments of the present invention are described below.

EMBODIMENT 1

Figure 1:
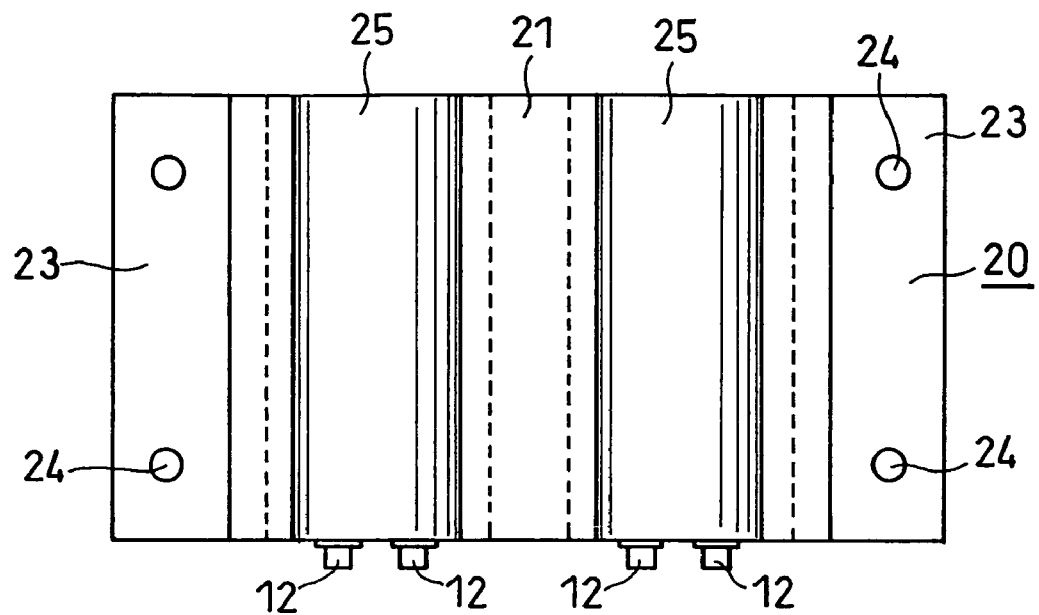
FIG. 1 is a plane view of a capacitor device in accordance with Embodiment 1 of the present invention.
Figure 2:
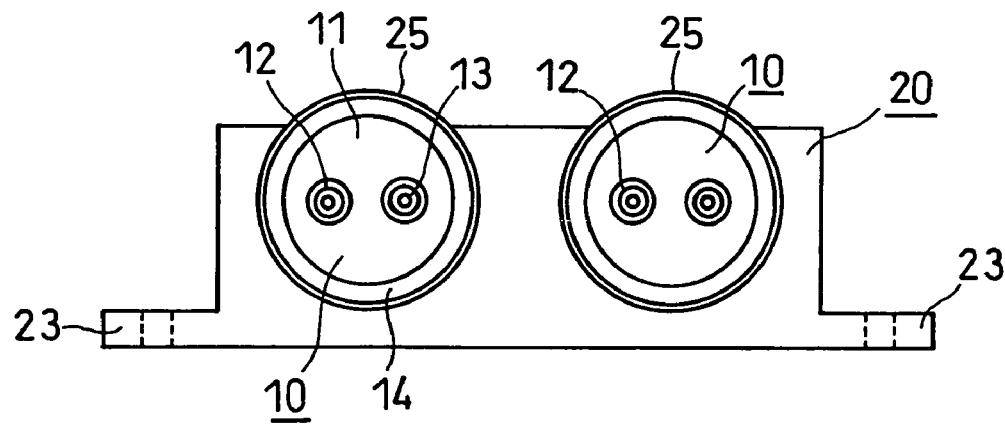
FIG. 2 is a front view of the capacitor device of FIG. 1.

FIG. 1 is a plane view of a capacitor device in accordance with Embodiment 1 of the present invention, and FIG. 2 is a front view of this capacitor device.

A capacitor 10 is a cylindrical aluminum electrolytic capacitor just like the conventional capacitor as described above, and is coated with a heat shrinking resin tube 14. A pair of terminals 12 is provided on a sealing plate 11 while being insulated from the sealing plate 11. The terminals 12 have, in the top, a screw hole 13 into which a bolt is screwed to fasten a bus bar. Although the capacitor 10 of this embodiment is coated with the heat shrinking resin tube 14 and the terminals 12 have the screw hole in the top, this is not to be construed as limiting in any way the capacitor of the present invention.

Figure 3:
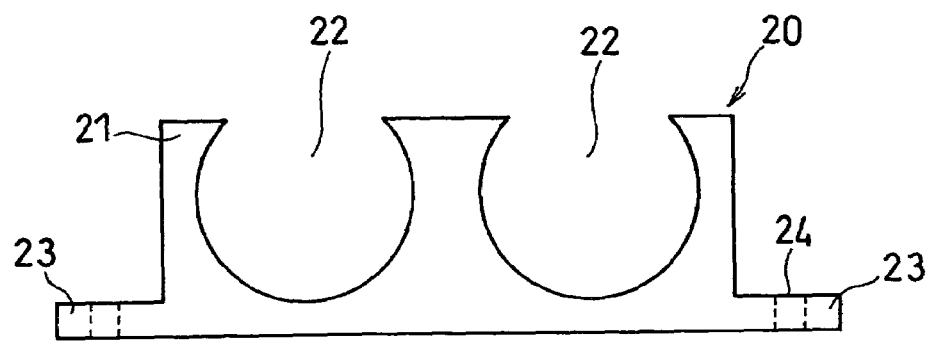
FIG. 3 is a front view of a holder used in the capacitor device of FIG. 2.

A holder 20 for holding the capacitor 10 is made of an aluminum alloy. As illustrated in FIG. 3, the holder 20 includes a thick body 21, having two holding parts 22 which are arc-shaped in cross section, and mounting parts 23, extending horizontally from the opposite lower parts of the body 21. The holding parts 22 accommodate the capacitors 10 in a sideways position and are open at the top. The mounting parts 23 have a screw hole 24 to secure the holder 20 to a capacitor-using device.

A heat shrinking resin tube 25 intervenes between the outer face of the capacitor 10 and the inner face of the holding part 22 of the holder. With the resin tube 25, the capacitors 10 are held in a sideways position in the holding parts 22 of the holder 20.

A fabrication method of this capacitor device is now described.

Figure 4:
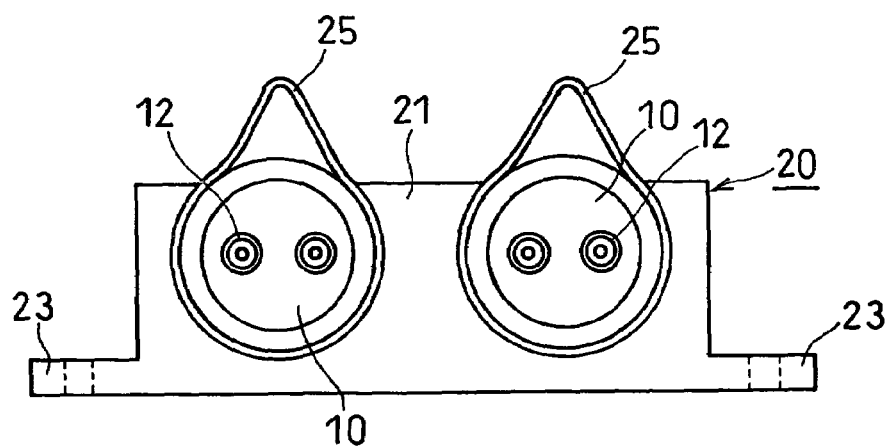
FIG. 4 is a front view of the capacitor device of FIG. 2 in a fabrication process.

First, the capacitor 10 is fitted into the heat shrinking resin tube 25 having an internal diameter greater than the external diameter of the capacitor 10. The capacitor 10 fitted in the resin tube 25 is inserted in a sideways position into the holding part 22, arc-shaped in cross section, of the holder 20 from the axial direction of the holding part 22. That is, the capacitor 10 is inserted into the holding part 22 such that the axial direction of the capacitor 10 agrees with the axial direction of the holding part 22. Subsequently, the resin tube is pulled outward from the upper opening of the holding part 22, as illustrated in FIG. 4.

Thereafter, by heating the resin tube 25 at a temperature of about 160° C., the resin tube is caused to shrink and adhere to the outer face of the capacitor 10. Due to the shrinkage, the thickness of the resin tube 25 increases, thereby closing the gap between the inner face of the holding part 22 and the outer face of the capacitor 10. As the result, the capacitor 10 is almost firmly held by the holding part 22, with the resin tube 25 between them, so that it will not slip off the holding part easily. The gap between the holding part 22 and the capacitor 10 may be about 0.3 to 0.5 mm, and a resin tube which has sufficient thickness to close the gap as the result of heat shrinkage may be used in the present invention.

The resin tube 25 may be heated by directly blowing hot air on the resin tube or by placing the capacitor 10 held in the holder 20 into a hot oven. However, it is preferable to heat the holder 20 from below. If the part of the resin tube 25 contacting the holding part 22 is heated by heating the holder 20 from below, the heated part shrinks. Thus, the part of the resin tube pulled out from the opening of the holding part is pulled into the holding part 22, so that the resin tube 25 shrinks uniformly. It is therefore preferable to employ this heating method.

In carrying out this heating method, it is suitable to use an aluminum alloy or a magnesium alloy as the material of the holder 20. In order that the capacitor 10 is held more firmly by the holding part 22 with the shrunk resin tube 25 between them, the following conditions are preferred. That is, the width of the opening of the holding part is less than twice the radius of the arc of said holding part. Further, the radius of the arc of the holding part 22, which is arc-shaped in cross section, is half the external diameter of the capacitor 10 plus a range of the thickness of the resin tube 25 before shrinking to the thickness of the resin tube after shrinking.

Heat shrinking resin tubes normally shrink in the axial direction (lengthwise) as well as the direction of the diameter (widthwise) when heated. It is therefore preferable to use a heat shrinking resin tube having a suitable length such that the ends of the capacitor are not exposed upon the heat shrinkage of the resin tube in the axial direction. Since the shrinkage rate of heat shrinking resin tubes in the axial direction is usually not more than 10%, it is easy to determine the suitable length as described above.

The heat shrinking resin tube 25 is preferably made of polyolefin, such as polyethylene or polypropylene, or polyvinyl chloride.

A capacitor device was fabricated using the capacitors 10 having an external diameter of 35.3 mm, the holder 20 of which the holding part 22 has an arc radius of 18.0 mm, and the resin tube 25 made of polyethylene having an internal diameter of 45.0 mm and a thickness of 0.3 mm. When the holder 20 was heated to 160° C. to cause the resin tube to shrink, the thickness of the resin tube increased to 0.45 mm due to the shrinkage. The capacitors of the resultant capacitor device were firmly fixed to the holding parts.

The capacitor device in which the capacitors 10 are held in the holding parts 22 can be fixed to, for example, a printed circuit board of an electronic device by placing the holder 20 on the circuit board and screwing it to the circuit board using the holes 24 of the mounting parts 23. The terminals 12 are connected to the printed circuit board or the electronic device fixed to the circuit board by means of bolts, solder or the like. In order to prevent the capacitors 10 held in the holding parts 22 from slipping off the holding parts, it is preferable to fix, to the circuit board, components which hold the bottom faces of the capacitors 10 and, if necessary, the top faces having the terminals 12.

As described above, since the capacitor device of this embodiment is so configured that the cylindrical capacitors are held in the holder in a sideways position, the height of the capacitor device can be reduced, so that it is possible to reduce the size of the capacitor device. Also, when the capacitors are connected to another electronic device, the connection distance between the terminals of each capacitor and the electronic device is shorter than the distance with the conventional capacitor in a vertical position. Therefore, the inductance (L) in a mounted state can be reduced.

Further, since this capacitor device does not need such parts as bolts and nuts to secure the capacitors 10 to the holder 20, the shape of the holder 20 can be simplified. As a result, it becomes possible to provide a low-cost capacitor device.

EMBODIMENT 2

Figure 5:
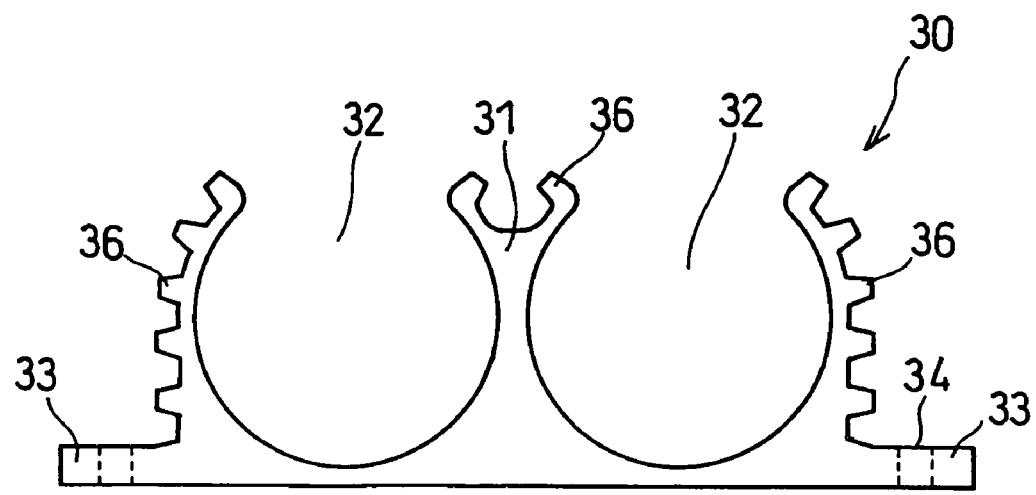
FIG. 5 is a front view of a holder used in a capacitor device in accordance with Embodiment 2 of the present invention.
Figure 6:
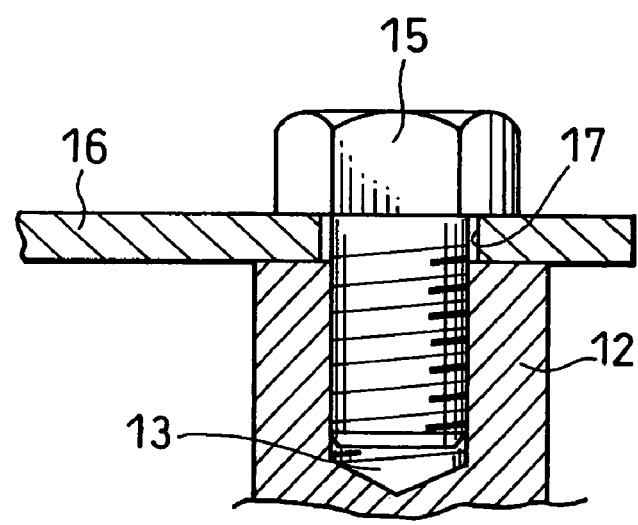
FIG. 6 is a cross-sectional view of the main part of a capacitor terminal to which a bus bar is fitted.
Figure 7:
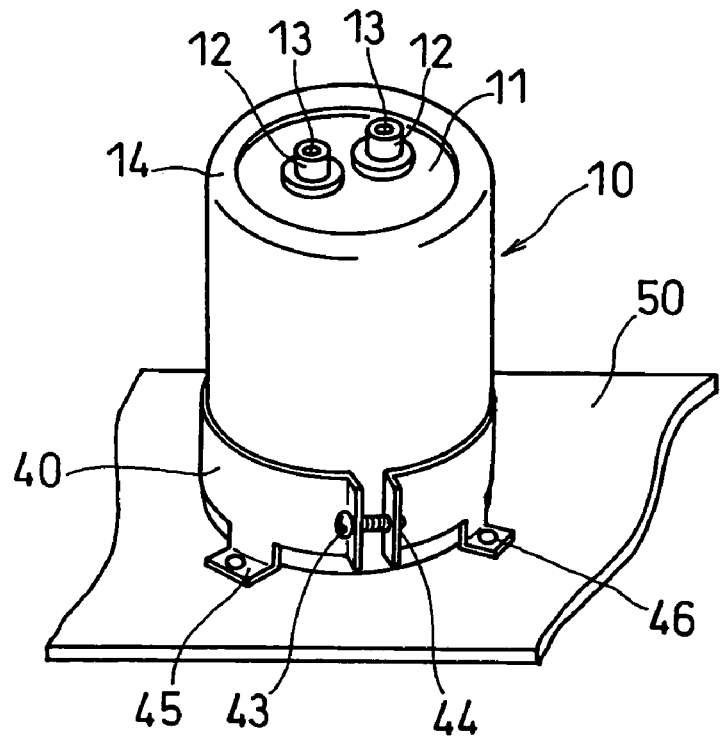
FIG. 7 is a perspective view of a conventional capacitor device.
Figure 8:
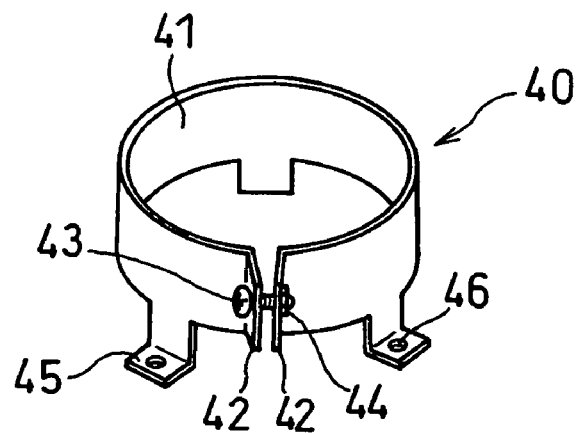
FIG. 8 is a perspective view of a holder used in the capacitor device of FIG. 7.

FIG. 5 illustrates a holder used in a capacitor device in accordance with this embodiment.

A holder 30 is made of an aluminum alloy and includes a body 31, having two holding parts 33 which are arc-shaped in cross section, and mounting parts 33, extending horizontally from the opposite lower parts of the body 31. The holding parts 32 accommodate the capacitors 10 in a sideways position and are open at the top. The mounting parts 33 have a screw hole 34 for securing the holder 30 to a capacitor-using device.

The body 31 is thinner than that of Embodiment 1 and has a large number of fins 36 at predetermined intervals on the outer faces of the holding parts 32. The fins 36 enable efficient radiation of heat even if the capacitors coated with the resin tube in the holding parts 32 generate heat.

Although the foregoing embodiments are directed to a holder having two holding parts, this is not to be construed as limiting in any way the present invention. The present invention is also applicable to holders having only one holding part or more than two holders.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A method of fabricating a capacitor device, said device comprising a cylindrical capacitor and a holder for holding the capacitor, said holder comprising a capacitor holding part that has an opening at the top and that is arc-shaped in cross section and a mounting part for mounting said holder itself to another device, said capacitor being held in a sideways position in the holding part of said holder with a heat shrinking resin tube interposed therebetween, said method comprising the steps of:

fitting said capacitor into the heat shrinking resin tube having an internal diameter greater than the external diameter of the capacitor and inserting the fitted capacitor into the holding part of said holder in a sideways position;

pulling the resin tube outward from the opening of the holding part; and heating said heat shrinking resin tube so that it shrinks and adheres to the outer face of said capacitor.

2. The method of fabricating a capacitor device in accordance with claim 1, wherein the heating of said heat shrinking resin tube is performed by heating the holder.

* * * * *